(12) United States Patent
Chen

(10) Patent No.: US 8,203,494 B2
(45) Date of Patent: Jun. 19, 2012

(54) TESTING METHOD OF MULTIBAND ANTENNA

(75) Inventor: Lin-Ching Chen, Hsinchu (TW)

(73) Assignee: Arcadyan Technology Corporation, Hsinchu (TW)

( * ) Notice: Subject to any disclaimer, the term of this patent is extended or adjusted under 35 U.S.C. 154(b) by 438 days.

(21) Appl. No.: 12/542,284

(22) Filed: Aug. 17, 2009

(65) Prior Publication Data

US 2010/0045542 A1 Feb. 25, 2010

(30) Foreign Application Priority Data

Aug. 19, 2008 (TW) ................................ 97131653 A

(51) Int. Cl.
 *H01Q 3/00* (2006.01)
(52) U.S. Cl. ........................................ 343/703; 342/360
(58) Field of Classification Search .................. 343/703; 342/360
See application file for complete search history.

(56) References Cited

U.S. PATENT DOCUMENTS

| | | | | | |
|---|---|---|---|---|---|
| 4,270,129 | A | * | 5/1981 | Herper et al. | 343/703 |
| 4,929,960 | A | * | 5/1990 | Kaylor et al. | 343/703 |
| 5,001,494 | A | * | 3/1991 | Dorman et al. | 343/703 |
| 5,119,105 | A | * | 6/1992 | Ngai et al. | 343/703 |
| 6,285,330 | B1 | * | 9/2001 | Perl | 343/703 |
| 2008/0129615 | A1 | * | 6/2008 | Breit et al. | 343/703 |

* cited by examiner

*Primary Examiner* — Tho G Phan
(74) *Attorney, Agent, or Firm* — Rabin & Berdo, P.C.

(57) ABSTRACT

A testing method of a multiband antenna is provided. The testing method includes the following steps. Firstly, whether a testing angle of a multiband antenna is less than a default value is determined, and if the testing angle is less than a default value, then the testing frequency is set equal to a first default frequency according to the frequency table so as to obtain a first testing result corresponding to the first default frequency when the multiband antenna is at the testing angle. Next, whether the testing frequency needs to be changed is determined, and if the testing frequency needs to be changed, then the testing frequency is set equal to a second default frequency according to the frequency table so as to obtain a second testing result corresponding to the second default frequency when the multiband antenna is at the testing angle.

25 Claims, 4 Drawing Sheets

30

| | | |
|---|---|---|
| <Set Equipment Wait Time> | 700 | |
| <Total Test Frequency Number> | 30 | |
| <Frequenct Table> | | |
| FReq | Standard Gain | Spectrum Level |
| 1880 | 10.63 | -25 |
| 1890 | 10.71 | -25 |
| 1900 | 10.78 | -25 |
| 2400 | 9.74 | -25 |
| 2412 | 9.83 | -25 |
| 2417 | 40 | -25 |
| 2422 | 9.95 | -25 |
| 2427 | 40 | -25 |
| 2432 | 40 | -25 |
| 2437 | 10.02 | -25 |
| 2442 | 40 | -25 |
| 2447 | 40 | -25 |
| 2450 | 10.12 | -25 |
| 2457 | 40 | -25 |
| 2462 | 10.18 | -25 |
| 2467 | 40 | -25 |
| 2472 | 10.23 | -25 |
| 2483 | 10.29 | -25 |
| 2500 | 10.38 | -25 |
| 4900 | 13.16 | -25 |
| 5150 | 9.67 | -25 |
| 5200 | 40 | -25 |
| 5250 | 9.41 | -25 |
| 5300 | 40 | -25 |
| 5350 | 8.55 | -25 |
| 5400 | 40 | -25 |
| 5450 | 40 | -25 |
| 5500 | 40 | -25 |
| 5750 | 40 | -25 |
| 5850 | 13.87 | -25 |

FIG. 2

TESTING METHOD OF MULTIBAND ANTENNA

This application claims the benefit of Taiwan application Serial No. 97131653, filed Aug. 19, 2008, the subject matter of which is incorporated herein by reference.

BACKGROUND OF THE INVENTION

1. Field of the Invention

The invention relates in general to a testing method of an antenna, and more particularly to a testing method of a multiband antenna.

2. Description of the Related Art

A conventional method of measuring an antenna field pattern emits a wireless signal with a specific frequency to a to-be-measured antenna, and then the to-be-measured antenna is rotated for by 360 degrees in increments of 0.5 degrees or 1 degree. Then, an antenna field pattern is drawn according to the antenna gain of the to-be-measured antenna corresponding to each testing angle, and the reception characteristics of the to-be-measured antenna at the testing frequency are determined according to the antenna field pattern.

However, as different wireless standards are provided, there are more and more testing frequencies need to be verified by the antenna. According to the conventional method of measuring an antenna field pattern, to measure the antenna gain of the to-be-measured antenna corresponding to another testing frequency, the to-be-measured antenna is rotated by 360 degrees in increments of 0.5 degrees or 1 degree again, largely increasing antenna verification time.

SUMMARY OF THE INVENTION

The invention is directed to a testing method of a multiband antenna. According to the testing method, all of the testing frequencies which need to be verified by a multiband antenna are set according to a frequency table, so that the verification of all testing frequencies will be done after the multiband antenna is rotated for one circle, largely reducing the verification time of the multiband antenna.

According to a first aspect of the present invention, a testing method of a multiband antenna is provided. The testing method of a multiband antenna includes the following steps. Firstly, whether a testing angle of a multiband antenna is less than a default angle is determined, and if the testing angle is less than the default angle, then the testing frequency is set equal to a first default frequency according to the frequency table so as to obtain a first testing result corresponding to the first default frequency when the multiband antenna is at the testing angle. Next, whether the testing frequency needs to be changed is determined, and if the testing frequency needs to be changed, then the testing frequency is set equal to a second default frequency according to the frequency table so as to obtain a second testing result corresponding to the second default frequency when the multiband antenna is at the testing angle.

According to a second aspect of the present invention, a testing method of a multiband antenna is provided. The testing method of a multiband antenna includes the following steps. Firstly, whether a testing angle of a multiband antenna is less than a first default value is determined, and if the testing angle is less than the first default value, then the testing frequency is set equal to a first default frequency according to the frequency table so as to obtain a first testing result corresponding to the first default frequency when the multiband antenna is at the testing angle, wherein the first default value is the default testing angle. Next, whether the default testing frequency times of the multiband antenna is larger than a second default value is determined, and if the default testing frequency times is larger than the second default value and the testing frequency needs to be changed, then the testing frequency is set equal to a second default frequency according to the frequency table so as to obtain a second testing result corresponding to the second default frequency when the multiband antenna is at the testing angle, wherein the second default value is the default testing frequency number. The frequency table is predetermined and stored in the computer controlling the testing device or is directly stored in the testing device having an in-built storage space, so that the to-be-measured multiband antenna does not need to add or change any hardware to the antenna testing system when verifying the testing frequencies.

The invention will become apparent from the following detailed description of the preferred but non-limiting embodiments. The following description is made with reference to the accompanying drawings.

BRIEF DESCRIPTION OF THE DRAWINGS

FIG. 2 shows a frequency table.

DETAILED DESCRIPTION OF THE INVENTION

Figure 1:
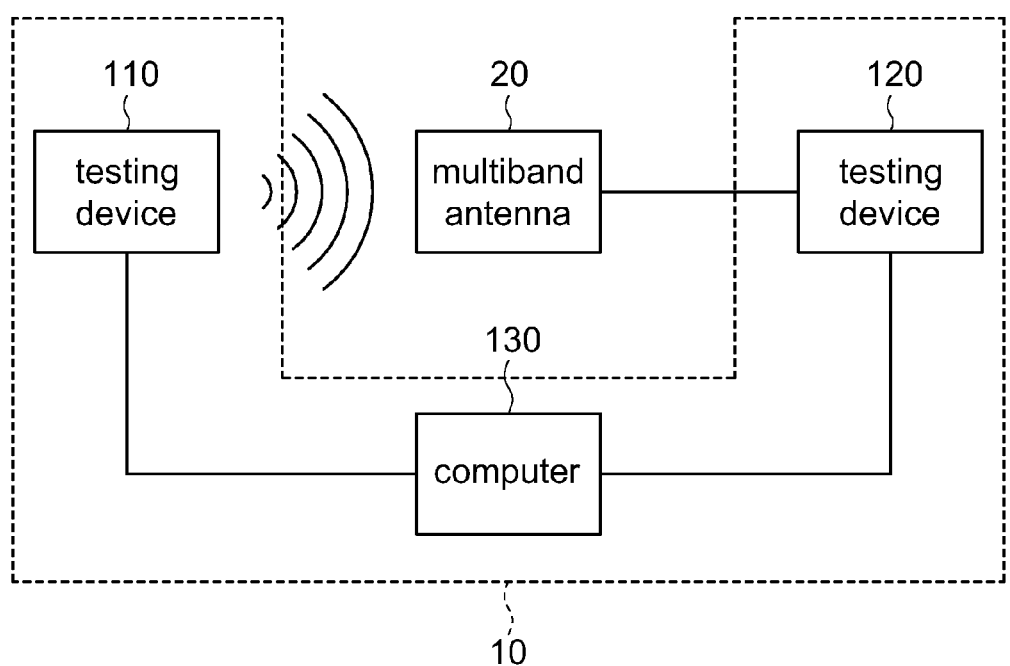
FIG. 1 shows a block diagram of an antenna testing system.

Referring to FIG. 1, a block diagram of an antenna testing system is shown. The antenna testing system 10 is used for verifying a multiband antenna 20. The antenna testing system 10 includes a testing device 110, a testing device 120 and a computer 130. The testing device 110 and the testing device 120 are electrically connected to the computer 130 for testing the multiband antenna 20. The testing device 110 and the testing device 120 are respectively a signal generator (SG) and a spectrum analyzer (SA) for example.

The computer 130 controls the testing device 110 to generate a wireless signal to the multiband antenna 20. The testing device 120 outputs a testing data according to the wireless signal received by the multiband antenna 20. The computer 130 outputs a testing result according to the testing data, and draws an antenna field pattern according to the testing result. The testing result is an antenna gain for example. The computer 130 having a frequency table stored therein sets respective to-be-verified testing frequencies according to the frequency table, so that the verification of all testing frequencies will be done after the multiband antenna 20 is rotated for one circle, largely reducing the verification time of the multiband antenna 20.

Referring to FIG. 2, a frequency table is shown. The frequency table 30 may include a set equipment wait time, a total test frequency number, a default frequency Freq, a standard gain, a spectrum level. The computer 130 sets the set equipment wait time of the testing device 120 according to the set equipment wait time, and starts frequency testing after the initial setting of the testing device is in a stable state. The total test frequency number denotes the number of testing frequencies to be verified by the multiband antenna 20.

When the multiband antenna 20 is rotated to a testing angle, the computer 130 sequentially sets the to-be-verified testing frequencies according to the default frequency Freq of the frequency table 30, so that the verification of all testing frequencies will be done after the multiband antenna 20 is rotated for one cycle. Besides, the computer 130 sets the testing device 120 according to the spectrum level of the frequency table 30 for measuring the wireless signal. The computer 130 obtains a corresponding antenna gain according to the standard gain of the frequency table 30.

Figure 3:
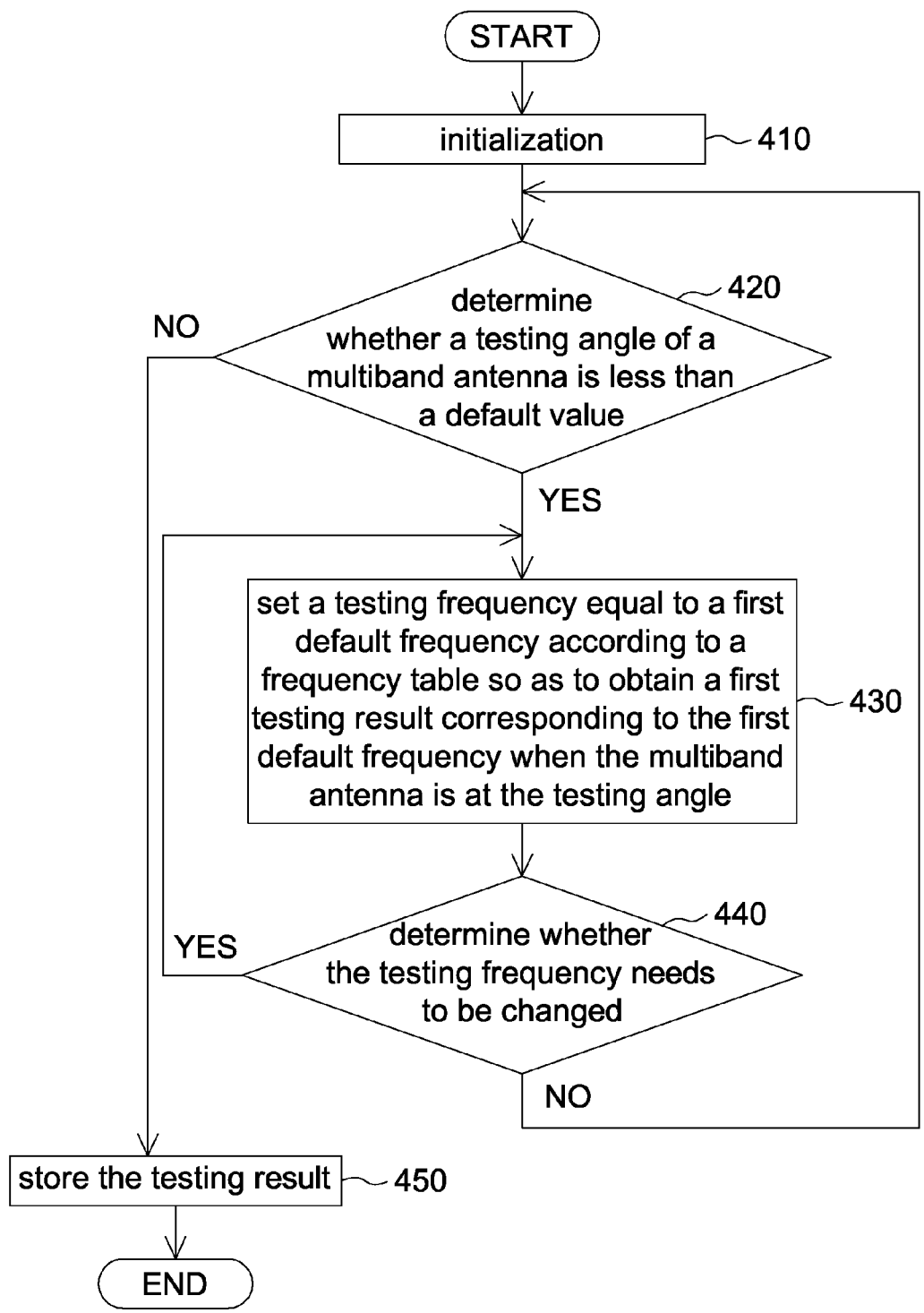
FIG. 3 shows a testing method of a multiband antenna according to a preferred embodiment of the invention.

Referring to FIG. 3, a testing method of a multiband antenna according to a preferred embodiment of the invention is shown. The testing method being applicable to the antenna testing system 10 includes the following steps. Firstly, as indicated in step 410, the testing device 110 or the testing device 120 is initialized. The testing device 110 or the testing device 120 is initiated according to a configuration file.

Next, as indicated in step 420, whether the testing angle of the multiband antenna 20 is less than a default value is determined, wherein the default value is 360 degrees for example. If the testing angle of the multiband antenna 20 is determined to be less than the default value, then step 430 is executed. In step 430, the computer 130, according to the frequency table 30, sets the testing frequencies of the testing device 110 and the testing device 120 equal to a default frequency so as to obtain a testing result corresponding to the default frequency when the multiband antenna 20 is at the testing angle. Besides, the computer 130 further sets a reference level of the testing device 120 according to the frequency table 30 so that the testing device 120 can accurately output a testing data.

Then, as indicated in step 440, whether the testing frequency needs to be changed is determined. In step 440, whether the number of setting times of testing frequency is larger than the total test frequency number of frequency table is determined so as to determine whether the testing frequency needs to be changed or not. If the number of setting times is not larger than the total test frequency number, this implies that the testing frequency needs to be changed, and step 430 is executed again. The computer 130, according to the frequency table 30, further sets the testing frequencies of the testing device 110 and the testing device 120 equal to another default frequency so as to obtain a testing result corresponding to the another default frequency when the multiband antenna 20 is at the same testing angle. Besides, the computer 130, according to the frequency table 30, further set a reference level of the testing device 120 so that the testing device 120 can accurately output a testing data.

To the contrary, if the number of setting times is larger than the total test frequency number, this implies that the testing frequency does not need to be changed. Meanwhile, the computer 130 sequentially sets the default frequencies of the frequency table 30 and obtains the testing results corresponding to the default frequencies of the frequency table 30 when the multiband antenna 20 is at the same testing angle. If the number of setting times is larger than the total test frequency number, the testing angle of the multiband antenna 20 is gradually increased, and step 420 is executed again.

If the testing angle is not less than a default value, this implies that the multiband antenna 20 is already rotated for one cycle. The computer 130 respectively stores the default frequencies corresponding to the testing results to different record files, and draws an antenna field pattern according to the testing result corresponding to the testing frequency ranked as the first priority. The antenna field patterns of other testing frequencies can be drawn according to corresponding record files by a drawing software.

Figure 4:
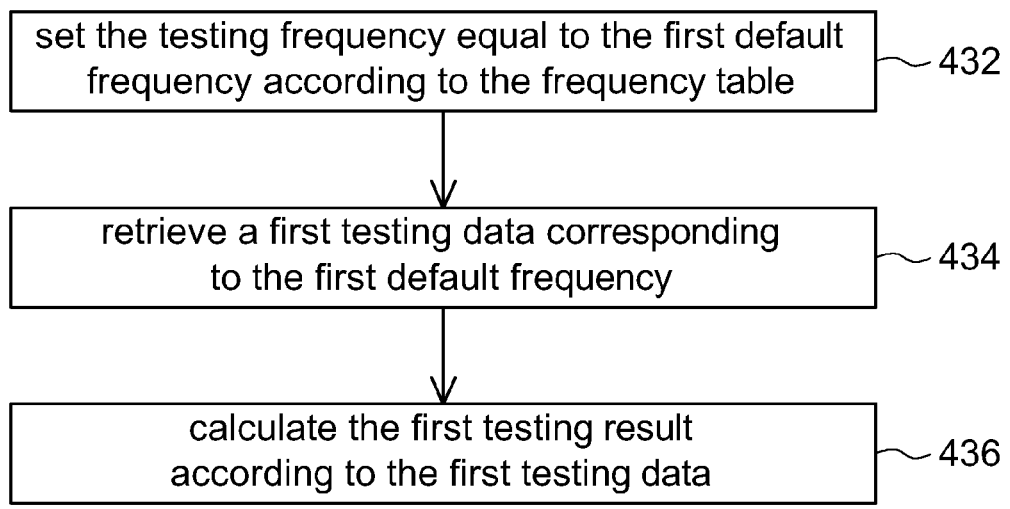
FIG. 4 shows a detailed flowchart of the step 430.

Referring to FIG. 4, a detailed flowchart of the step 430 is shown. Step 430 further includes the following steps. Firstly, as indicated in step 432, the computer 130, according to the frequency table 30, sets the testing frequencies of the testing device 110 and the testing device 120 equal to respective default frequencies. Next, as indicated in step 434, the computer 130 retrieves a testing data corresponding to the default frequency from the testing device 120. Next, as indicated in step 436, the computer 130 calculates a testing result according to the testing data. The computer 130 sets different default frequencies to the testing device 110 and the testing device 120, according to the frequency table 30, so the computer 130 retrieves a testing data corresponding to different default frequency from the testing device 120. The computer 130 can calculate testing results corresponding to different default frequencies according to the testing data corresponding to different default frequencies.

According to the testing method of a multiband antenna disclosed in the above embodiments of the invention, all of the testing frequencies which need to be verified by a multiband antenna are set according to a frequency table, so that the verification of all testing frequencies will be done after the multiband antenna is rotated for one circle, largely reducing the verification time of the multiband antenna.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A testing method of a multiband antenna, comprising:
    (a) determining whether a testing angle of a multiband antenna is less than a default value;
    (b) setting a testing frequency equal to a first default frequency according to a frequency table so as to obtain a first testing result corresponding to the first default frequency when the multiband antenna is at the testing angle if the testing angle is less than a default value;
    (c) determining whether the testing frequency needs to be changed; and
    (d) setting the testing frequency equal to a second default frequency according to the frequency table so as to obtain a second testing result corresponding to the second default frequency when the multiband antenna is at the testing angle if the testing frequency needs to be changed.

2. The testing method according to claim 1, further comprising:
    (e) respectively storing the first testing result and the second testing result if the testing angle is not less than the default value.

3. The testing method according to claim 1, further comprising:
    (e') drawing an antenna field pattern according to the first testing result if the testing angle is not less than the default value.

4. The testing method according to claim 1, wherein the default value is 360 degrees in the step (a).

5. The testing method according to claim 1, wherein the step (b) comprises:
    (b1) setting the testing frequency equal to the first default frequency according to the frequency table;
    (b2) retrieving a first testing data corresponding to the first default frequency; and
    (b3) calculating the first testing result according to the first testing data.

6. The testing method according to claim 1, wherein the step (d) comprises:
    (d1) setting the testing frequency equal to the second default frequency according to the frequency table;

(d2) retrieving a second testing data corresponding to the second default frequency; and
(d3) calculating the second testing result according to the second testing data.

7. The testing method according to claim 1, wherein whether the number of setting times of testing frequency is larger than a total test frequency number of the frequency table is determined in the step (c).

8. The testing method according to claim 1, wherein the step (a) is executed if the testing frequency does not need to be changed.

9. The testing method according to claim 1, wherein a first reference level is set according to the frequency table in the step (b).

10. The testing method according to claim 1, wherein a second reference level is set according to the frequency table in the step (d).

11. A testing method of a multiband antenna, comprising:
(a) determining whether a testing angle of a multiband antenna is less than a default value;
(b) setting a testing frequency equal to a first default frequency according to a frequency table so as to obtain a first testing result corresponding to the first default frequency when the multiband antenna is at the testing angle if the testing angle is less than the default value;
(c) determining whether a number of setting times of testing frequency is larger than a total test frequency number of the frequency table; and
(d) setting the testing frequency equal to a second default frequency according to the frequency table so as to obtain a second testing result corresponding to the second default frequency when the multiband antenna is at the testing angle if the number of setting times of testing frequency is not larger than the total test frequency number of the frequency table;
(e) executing the step (a) if the number of setting times of testing frequency is larger than the total test frequency number of the frequency table.

12. The testing method according to claim 11, further comprising:
(f) respectively storing the first testing result and the second testing result if the testing angle is not less than the default value.

13. The testing method according to claim 12, wherein the first testing result and the second testing result are respectively stored in a first record file and a second record file in the step (f).

14. The testing method according to claim 11, further comprising:
(f') drawing an antenna field pattern according to the first testing result if the testing angle is not less than the default value.

15. The testing method according to claim 11, wherein the default value is 360 degrees in the step (a).

16. The testing method according to claim 11, wherein the step (b) comprises:
(b1) setting the testing frequency equal to the first default frequency according to the frequency table;
(b2) retrieving a first testing data corresponding to the first default frequency; and
(b3) calculating the first testing result according to the first testing data.

17. The testing method according to claim 16, wherein the first default frequency is set to a testing device according to the frequency table in the step (b1).

18. The testing method according to claim 16, wherein the first testing data is retrieved from the testing device in the step (b2).

19. The testing method according to claim 16, wherein a computer calculates the first testing result according to the first testing data in the step (b3).

20. The testing method according to claim 11, wherein the step (d) comprises:
(d1) setting the testing frequency equal to the second default frequency according to the frequency table;
(d2) retrieving a second testing data corresponding to the second default frequency; and
(d3) calculating the second testing result according to the second testing data.

21. The testing method according to claim 20, wherein the second default frequency is set to a testing device according to the frequency table in the step (d1).

22. The testing method according to claim 20, wherein the second testing data is retrieved from a testing device in the step (d2).

23. The testing method according to claim 20, wherein a computer calculates the second testing result according to the second testing data in the step (d3).

24. The testing method according to claim 11, wherein a first reference level is set according to the frequency table in the step (b).

25. The testing method according to claim 11, wherein a second reference level is set according to the frequency table in the step (d).

* * * * *